(12) United States Patent
Rajan et al.

(10) Patent No.: US 11,848,359 B2
(45) Date of Patent: Dec. 19, 2023

(54) METHOD OF FORMING LATERAL PN JUNCTIONS IN III-NITRIDES USING P-TYPE AND N-TYPE CO-DOPING AND SELECTIVE P-TYPE ACTIVATION AND DEACTIVATION

(71) Applicant: Ohio State Innovation Foundation, Columbus, OH (US)

(72) Inventors: Siddharth Rajan, Columbus, OH (US); Mohammad Wahidur Rahman, Columbus, OH (US); Hareesh Chandrasekar, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 216 days.

(21) Appl. No.: 17/205,539

(22) Filed: Mar. 18, 2021

(65) Prior Publication Data
US 2021/0296449 A1 Sep. 23, 2021

Related U.S. Application Data

(60) Provisional application No. 62/991,681, filed on Mar. 19, 2020.

(51) Int. Cl.
*H01L 29/20* (2006.01)
*H01L 21/18* (2006.01)
*H01L 21/02* (2006.01)

(52) U.S. Cl.
CPC ...... *H01L 29/2003* (2013.01); *H01L 21/0254* (2013.01); *H01L 21/182* (2013.01)

(58) Field of Classification Search
CPC .......... H01L 29/2003; H01L 21/0254; H01L 21/182
See application file for complete search history.

(56) References Cited

U.S. PATENT DOCUMENTS 5,902,393 A * 5/1999 Nido ............... H01L 33/007
117/89
2003/0089942 A1 * 5/2003 Bhattacharyya ...........
H01L 21/28202
257/310
2006/0286753 A1 * 12/2006 Barthelmess ....... H01L 29/7395
257/E29.037

(Continued)

OTHER PUBLICATIONS

S.J. Pearton, H. Cho, F. Ren, J.-I. Chyi, J. Han & R.G. Wilson "Properties and Effects of Hydrogen in GaN" MRS Internet Journal of Nitride Semiconductor Research vol. 5, pp. 540-550 (2000) (Year: 2020).*

(Continued)

*Primary Examiner* — Jay C Chang
*Assistant Examiner* — Siangluai Mang
(74) *Attorney, Agent, or Firm* — Meunier Carlin & Curfman LLC

(57) ABSTRACT

Methods are provided of selectively obtaining n-type and p-type regions from the same III-Nitride layer deposited on a substrate without using diffusion or ion-implantation techniques. The III-Nitride layer is co-doped simultaneously with n-type and p-type dopants, with p-type dopant concentration higher than n-type dopant to generate p-n junctions. The methods rely on obtaining activated p-type dopants only in selected regions to generate p-type layers, whereas the rest of the regions effectively behave as an n-type layer by having deactivated p-type dopant atoms.

13 Claims, 15 Drawing Sheets

(56) References Cited

U.S. PATENT DOCUMENTS

| | | | |
|---|---|---|---|
| 2015/0041965 A1* | 2/2015 | Schulze | H01L 29/7813 438/478 |
| 2019/0140134 A1* | 5/2019 | Mann | H01L 33/0075 |
| 2019/0164899 A1* | 5/2019 | Hu | H01L 21/76816 |
| 2019/0311914 A1* | 10/2019 | Cheng | H01L 29/207 |
| 2019/0319111 A1* | 10/2019 | Suh | H01L 29/7786 |
| 2020/0105917 A1* | 4/2020 | Okita | H01L 29/205 |
| 2022/0199826 A1* | 6/2022 | Kocon | H01L 29/7816 |

OTHER PUBLICATIONS

Polyakov, A. Y., et al. "Fermi level dependence of hydrogen diffusivity in GaN." Applied Physics Letters 79.12 (2001): 1834-1836. https://aip.scitation.org/doi/abs/10.1063/1.1404398.

Bajaj, Sanyam, et al. "Simulation of enhancement mode GaN HEMTs with threshold>5 V using p-type buffer." arXiv preprint arXiv:1511.04438 (2015).

* cited by examiner

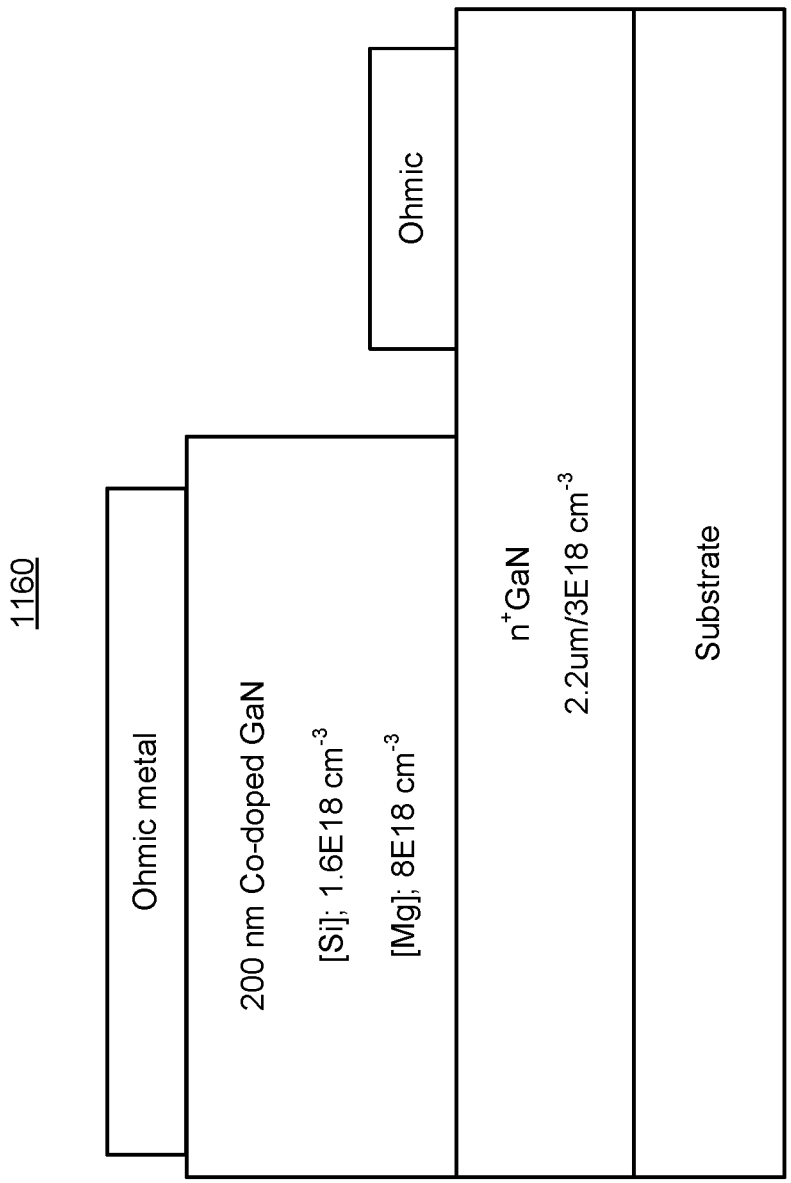

1600

| Frequency | 1 kHz | 10 kHz | 100 kHz | 1 MHz |
|---|---|---|---|---|
| Devices with 30 um diameters after activation at 900 C for 30 min in $N_2$ ||||
| Measured zero capacitance [$nF/cm^2$] | 65 | 63 | 60 | 57 |
| Calculated zero capacitance [$nF/cm^2$] ||||
| The co-doped layer is p-type || The co-doped layer is insulating ||
| 67 || 30 ||

FIG. 16

METHOD OF FORMING LATERAL PN JUNCTIONS IN III-NITRIDES USING P-TYPE AND N-TYPE CO-DOPING AND SELECTIVE P-TYPE ACTIVATION AND DEACTIVATION

CROSS-REFERENCE TO RELATED APPLICATIONS

This application claims the benefit of U.S. provisional patent application No. 62/991,681, filed on Mar. 19, 2020, and entitled "Method For Selective Area Doping Of Gallium Nitride," the disclosure of which is expressly incorporated herein by reference in its entirety.

BACKGROUND

The realization of several device topologies requires selective area doping of semiconductors. Currently, selective area doping of gallium nitride (GaN) and related semiconductors is very challenging, and this has prevented the realization of key device structures, including high threshold voltage transistors, vertical transistors.

Gallium nitride vertical transistors have several applications for power switching due to the superior figure of merit of GaN in terms of breakdown voltage, on-resistance, and switching losses. One of the key challenges for creating vertical transistors is the need to create patterned p- and n-type regions to define apertures. FIGS. 1 and 2 show two possible topologies for a vertical transistor based on GaN. In both cases, p and n regions must be defined laterally. Currently, two methods have been used to achieve this: implantation and regrowth. In the case of implantation, the damage caused by the implantation process, and the high thermal budget necessary for the activation anneal have both been significantly challenging. Regrowth leads to high interfacial impurities which can degrade breakdown, as well as additional process complexity.

It is with respect to these and other considerations that the various aspects and embodiments of the present disclosure are presented.

SUMMARY

Methods are provided of selectively obtaining n- and p-type regions from the same III-Nitride layer deposited on a substrate without using diffusion or ion-implantation techniques. The III-Nitride layer is co-doped simultaneously with n-type and p-type dopants, with p-type dopant concentration higher than n-type dopant to generate p-n junctions. The methods rely on obtaining activated p-type dopants only in selected regions to generate p-type layers, whereas the rest of the regions effectively behave as n-type layer by having deactivated p-type dopant atoms.

In an implementation, a semiconductor structure comprises: a first region doped with a p-type dopant, an n-type dopant, and a passivating species, such that the passivating species deactivates an acceptor, and an active p-type dopant concentration is less than an active donor concentration ($N_D$), thus creating a n-type layer; and a second region adjacent the first region, wherein the second region is doped with the p-type dopant, the n-type dopant, and wherein the concentration of the passivating species is lower than the first region so that a p-type dopant concentration is higher than the active donor concentration ($N_D$), thus creating a p-type layer.

In an implementation, a semiconductor structure comprises: a first region doped with a p-type dopant, a compositionally graded III-Nitride alloy that creates positive polarization charge in first region, and a passivating species, such that the passivating species deactivates an acceptor, and an active p-type dopant concentration is less than a positive polarization charge ($N_{DP}$), thus creating a n-type layer; and a second region adjacent the first region, wherein the second region is doped with the p-type dopant, the compositionally graded III-Nitride alloy that creates positive polarization charge in the second region, and wherein the concentration of the passivating species is lower than the first region so that the p-type dopant concentration is higher than the positive polarization charge concentration ($N_{DP}$), thus creating a p-type layer.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings:

FIGS. 11A, 11B, and 11C show illustrations of the mechanism for a Co-doped/N-type (CN) structure before activation, after activation, and the epitaxial CN structure, respectively;

FIG. 16 is a table showing the calculated zero capacitance considering each depletion width and Debye length and the measured zero capacitance with various frequency.

DETAILED DESCRIPTION

Figure 2:
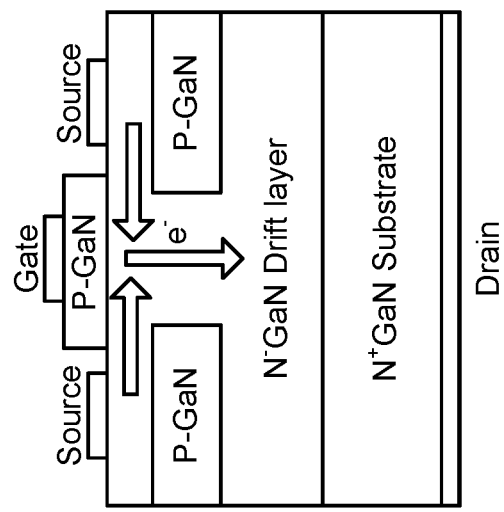
FIG. 2 (prior art) shows another conventional topology for a vertical transistor based on GaN.
Figure 1:
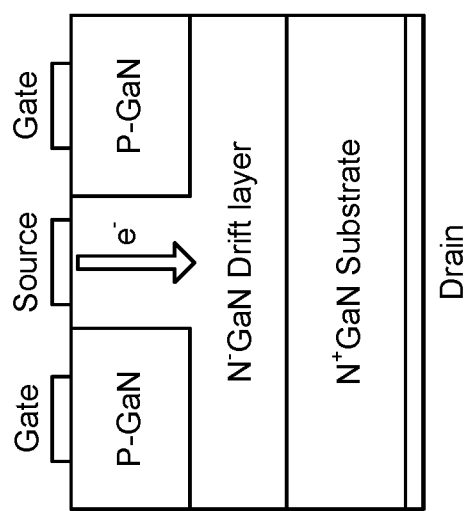
FIG. 1 (prior art) shows a conventional topology for a vertical transistor based on GaN.

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

The present disclosure presents a method of selectively obtaining n-type and p-type regions from the same III-Nitride layer deposited on a substrate without using diffusion or ion-implantation techniques. The III-Nitride layer is co-doped simultaneously with n-type and p-type dopants, with p-type dopant concentration higher than n-type dopant to generate p-n junctions. The method relies on obtaining activated p-type dopants only in selected regions to generate p-type layers, whereas the rest of the regions effectively behave as n-type layer by having deactivated p-type dopant atoms.

Such selective activation/de-activation of co-doped can be achieved either by: (i) selectively depositing an additional overlayer, which acts as a diffusion barrier for hydrogen, on certain pre-patterned regions to prevent activation of the p-type dopants giving n-type regions (regions which lack this diffusion barrier act as p-type regions since the p-type dopants therein are activated); or (ii) selective treatment of certain regions with hydrogen containing species which also de-activates p-type dopants giving an n-type region while regions not subject to such a treatment remain p-type.

This technique can be used to fabricate any III-Nitride devices which require n-type and p-type regions in pre-selected areas including but not limited to lateral p-n junctions, MOSFETs, and guard ring structures.

Methods are described herein for achieving laterally patterned p-type and n-type layers through variations in the activation of acceptor dopants in co-doped films that contain acceptors (such as Mg (magnesium)) and donors (such as Si (silicon)). The selective area activation can be achieved variations in the density of H (hydrogen), which forms a complex with acceptor Mg.

Consider a region doped with Si and Mg, such that the concentration [Mg]>[Si]. If all acceptors are activated, in such a film, the material will be p-type. However, if the Mg acceptors are bound to H, and therefore not activated to be acceptors, then the material will be n-type. By selectively removing H from certain regions of the material, p-type and n-type conductivity is created within the same film.

Figure 3:
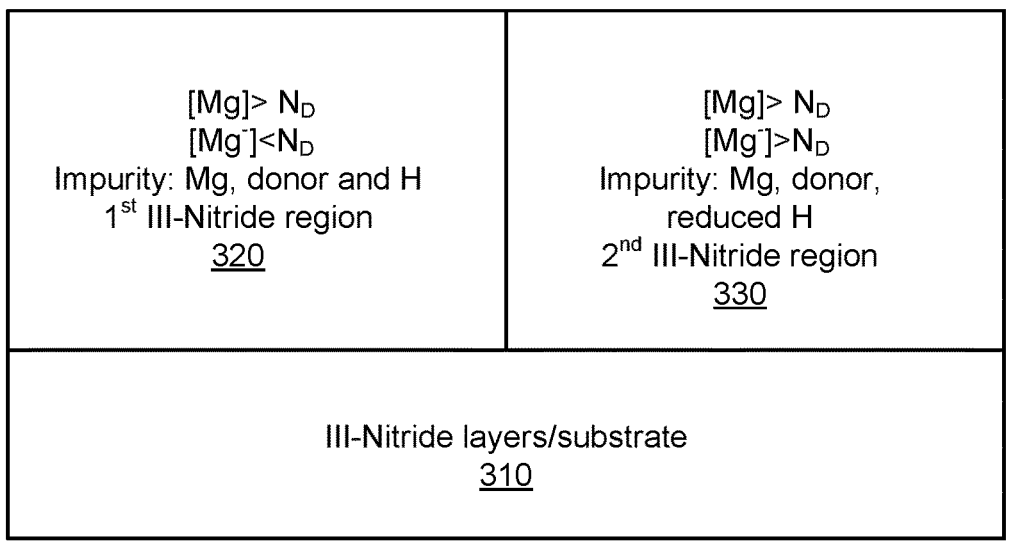
FIG. 3 is a diagram of an implementation of a III-Nitride semiconductor layer structure.
Figure 4:
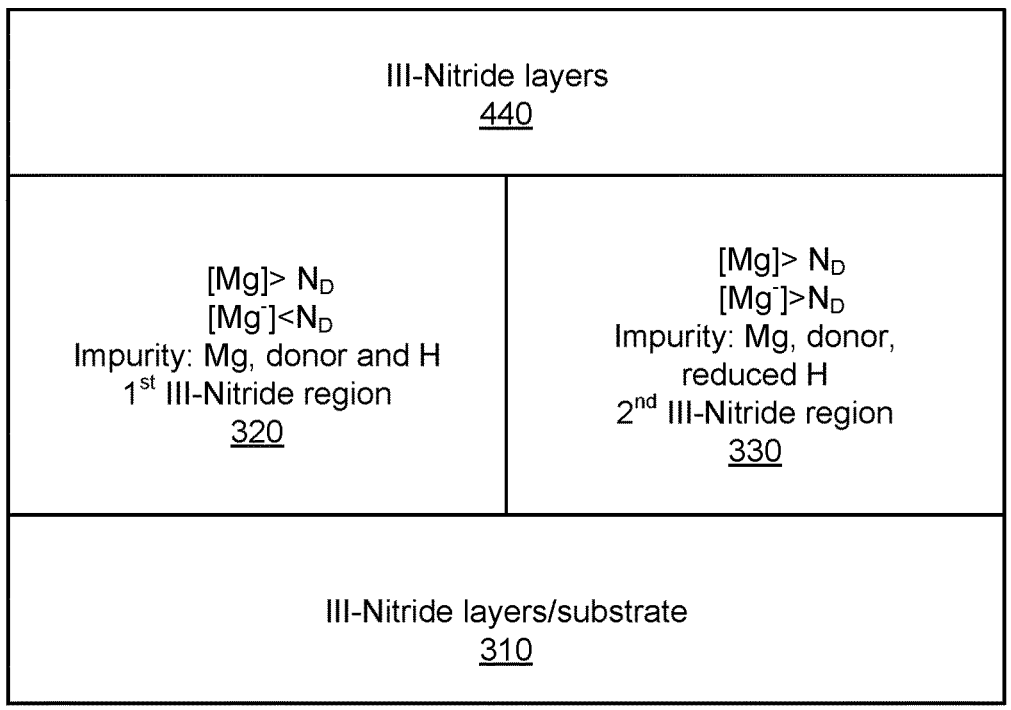
FIG. 4 is a diagram of another implementation of a III-Nitride semiconductor layer structure.
Figure 5:
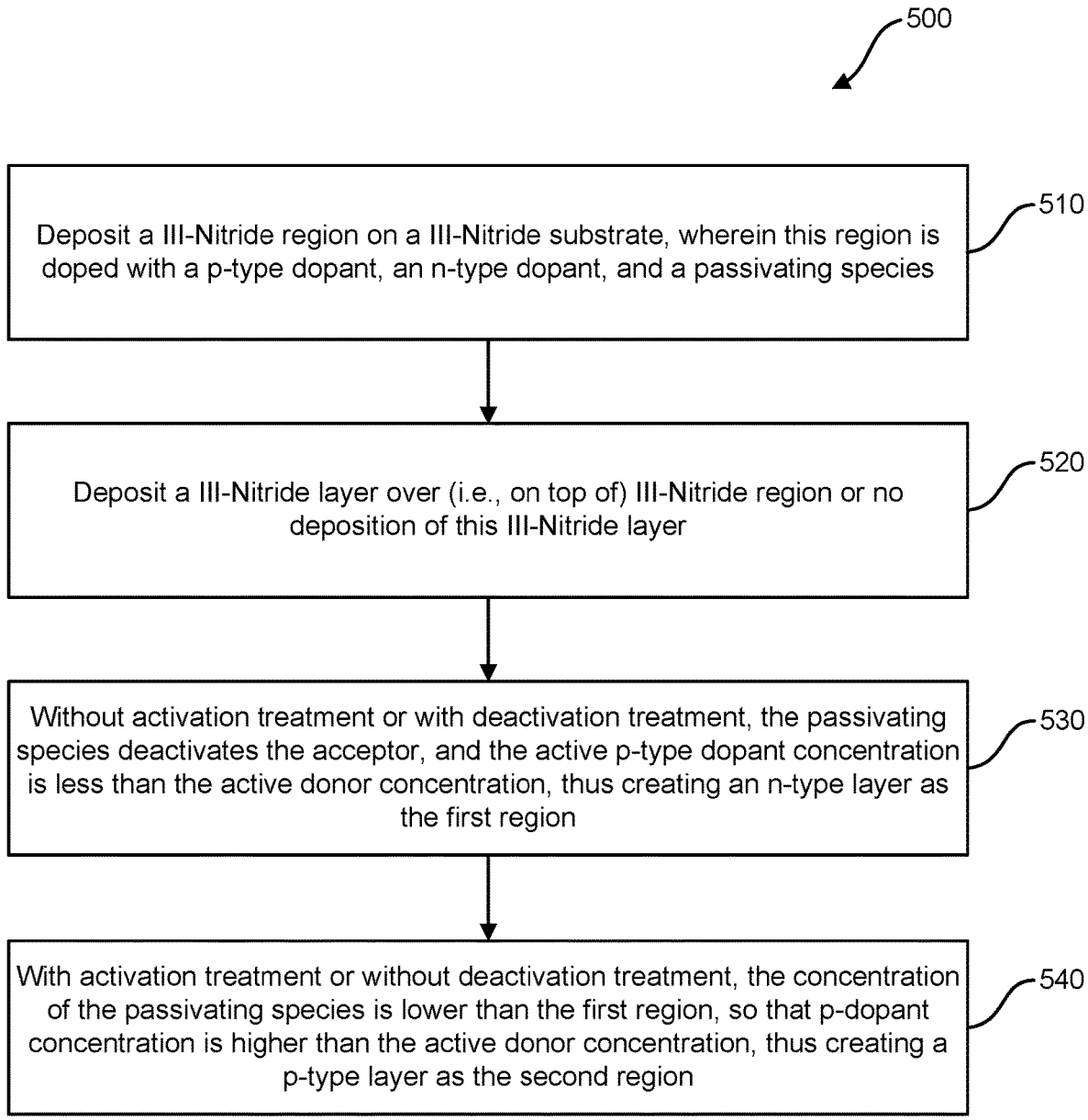
FIG. 5 is an operational flow of an implementation of a method for fabricating a III-Nitride semiconductor structure.

A III-Nitride semiconductor layer structure comprising adjacent regions is described. FIG. 3 is a diagram of an implementation of a III-Nitride semiconductor layer structure 300, and FIG. 4 is a diagram of another implementation of a III-Nitride semiconductor layer structure 400 similar to the structure 300 of FIG. 3 and with III-Nitride overlayers. FIG. 5 is an operational flow of an implementation of a method 500 for fabricating a III-Nitride semiconductor structure, such as the structure 300 or the structure 400.

Each structure 300 and 400 has a substrate 310 that may comprise one or more III-Nitride layers. Each structure 300 and 400 has a first region 320 and a second region 330 disposed on the substrate 310, adjacent each other.

The first region 320 is doped with a p-type dopant (such as Mg), an n-type dopant (such as Si, Ge or any donor), and a passivating species (such as H), such that the passivating species deactivates the acceptor, and the active p-type dopant concentration ($[Mg^-]$) is less than the active donor concentration ($N_D$), thus creating an n-type layer.

The second region 330 is doped with a p-type dopant, an n-type dopant, and where the concentration of the passivating species is sufficiently lower than the first region 320, so that the p-type dopant concentration ($[Mg^-]$) is higher than the active donor concentration ($N_D$), thus creating a p-type layer.

In the implementation of FIG. 4, the structure 400 shows an overlayer of III-Nitride layers 440 over the first region 320 and second region 330.

At 510, deposit a III-Nitride region on a III-Nitride substrate, wherein this region is doped with a p-type dopant, an n-type dopant, and a passivating species. At 520, optionally, depending on the implementation, deposit a III-Nitride layer over (i.e., on top of) this III-Nitride region. At 530, without activation treatment or with deactivation treatment, the passivating species deactivates the acceptor, and the active p-type dopant concentration is less than the active donor concentration, thus creating an n-type layer as the first region. At 540, with activation treatment or without deactivation treatment, the concentration of the passivating species is lower than the first region, so that p-dopant concentration is higher than the active donor concentration, thus creating a p-type layer as the second region adjacent the first III-Nitride region.

Figure 6:
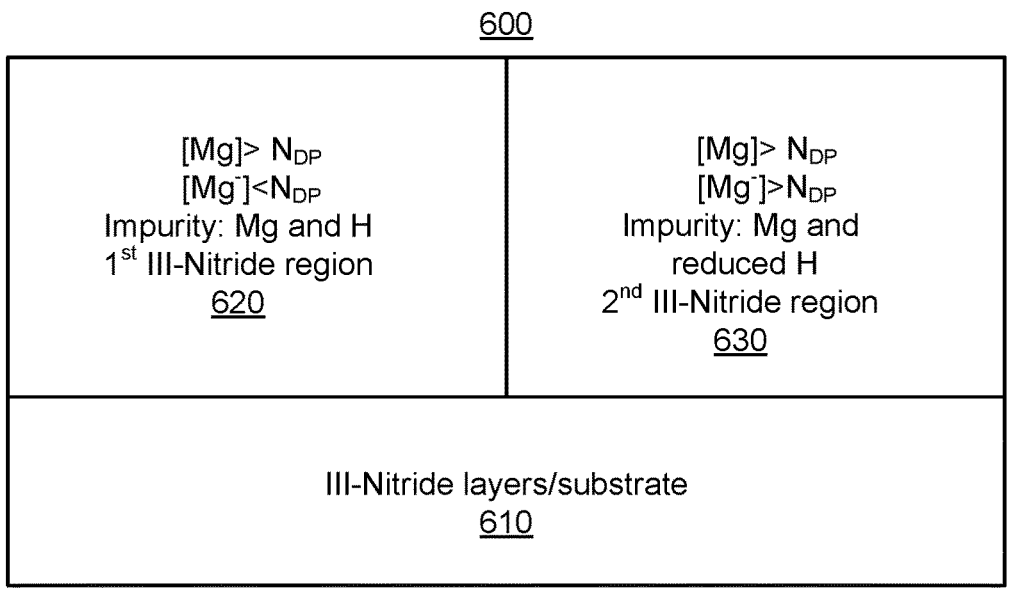
FIG. 6 is a diagram of another implementation of a III-Nitride semiconductor layer structure.
Figure 7:
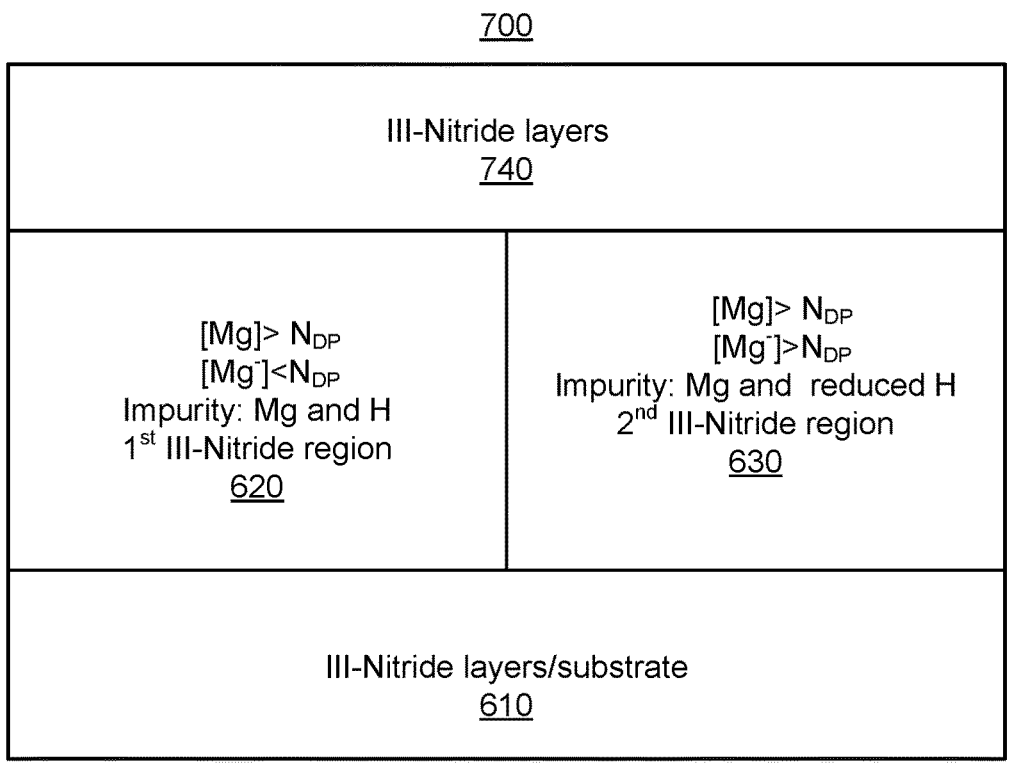
FIG. 7 is a diagram of another implementation of a III-Nitride semiconductor layer structure.
Figure 8:
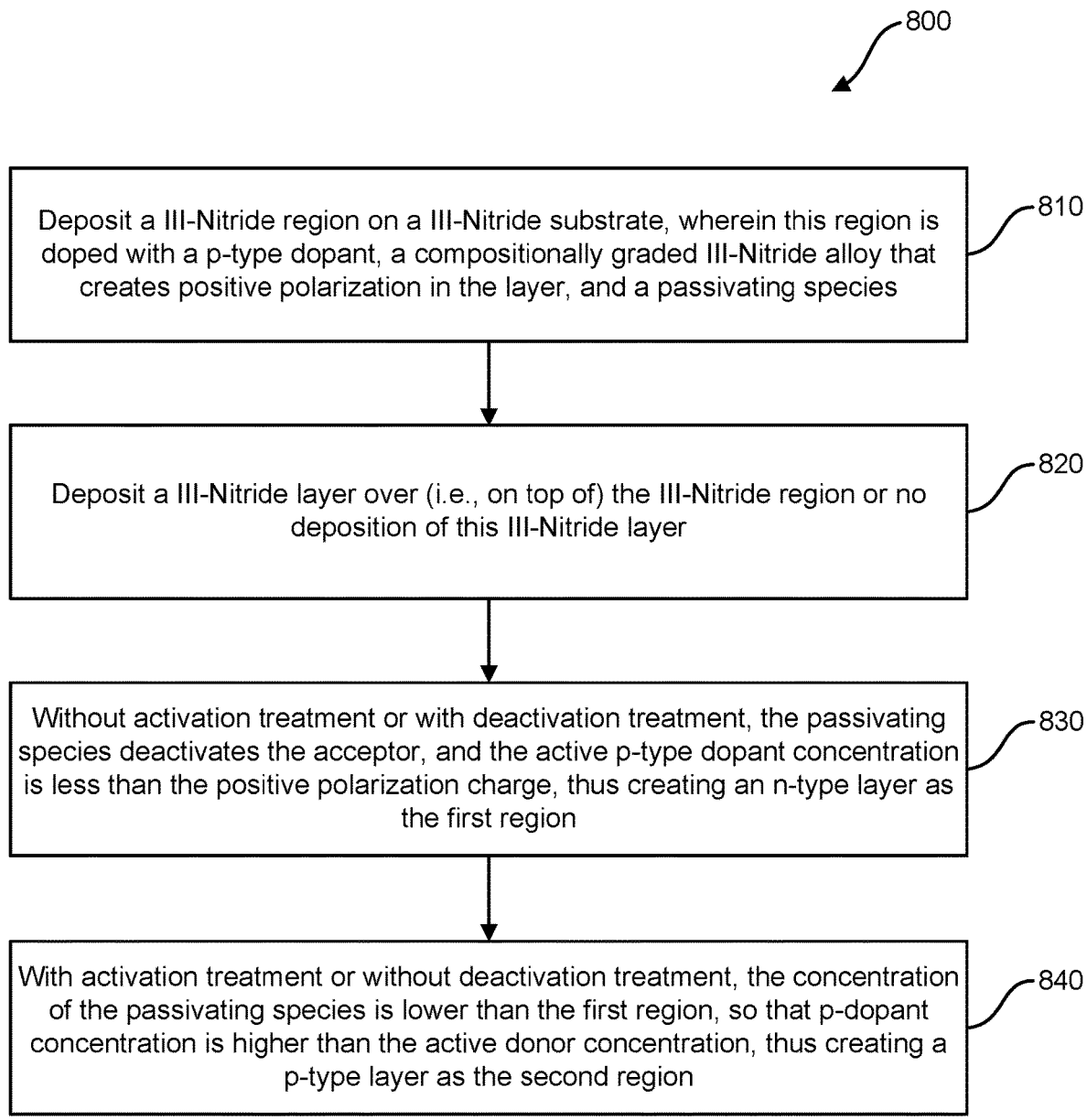
FIG. 8 is an operational flow of another implementation of a method for fabricating a III-Nitride semiconductor structure.

A III-Nitride semiconductor layer structure comprising adjacent regions is described. FIG. 6 is a diagram of another implementation of a III-Nitride semiconductor layer structure 600, and FIG. 7 is a diagram of another implementation of a III-Nitride semiconductor layer structure 700 similar to the structure 600 of FIG. 6 and with III-Nitride overlayers. FIG. 8 is an operational flow of another implementation of a method 800 for fabricating a III-Nitride semiconductor structure, such as the structure 600 or the structure 700.

Each structure 600 and 700 has a substrate 610 that may comprise one or more III-Nitride layers. Each structure 600 and 700 has a first region 620 and a second region 630 disposed on the substrate 610, adjacent each other.

The first region 620 is a compositionally graded III-Nitride alloy that creates positive polarization charge in the layer, doped with a p-type dopant (such as Mg) and a passivating species (such as H), such that the passivating species deactivates the acceptor, and the active p-type dopant concentration ($[Mg^-]$) is less than the positive polarization charge ($N_{DP}$), thus creating a n-type layer.

The second region 630 is a compositionally graded III-Nitride alloy that creates positive polarization charge in the layer and doped with a p-type dopant, where the concentration of the passivating species is sufficiently lower than the first region, so that the p-type dopant concentration ($[Mg^-]$) is higher than the positive polarization charge concentration ($N_{DP}$), thus creating a p-type layer.

In the implementation of FIG. 7, the structure 700 shows an overlayer of III-Nitride layers 740 over the first region 620 and second region 630.

At 810, deposit a III-Nitride region on a III-Nitride substrate, wherein this region is doped with a p-type dopant, a compositionally graded III-Nitride alloy that creates positive polarization in the layer, and a passivating species. At 820, optionally, depending on the implementation, deposit a III-Nitride layer over (i.e., on top of) this III-Nitride region. At 830, without activation treatment or with deactivation treatment, the passivating species deactivates the acceptor, and the active p-type dopant concentration is less than the positive polarization charge, thus creating an n-type layer as the first region. At 840, with activation treatment or without deactivation treatment, the concentration of the passivating species is lower than the first region, so that p-dopant concentration is higher than the active donor concentration, thus creating a p-type layer as second region adjacent the first III-Nitride region.

Figure 9:
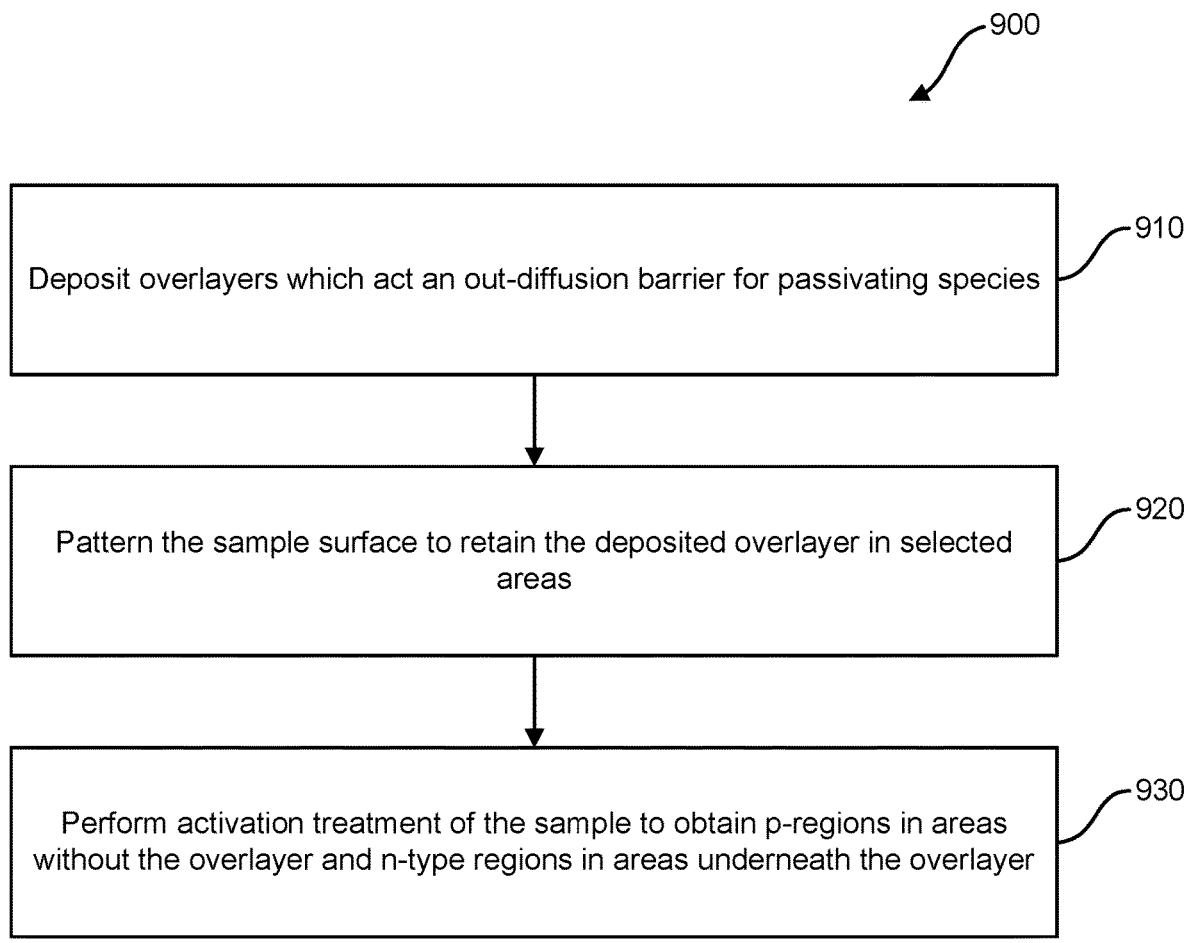
FIG. 9 is an operational flow of another implementation of a method for fabricating a III-Nitride semiconductor structure.

FIG. 9 is an operational flow of another implementation of a method 900 for fabricating a III-Nitride semiconductor structure. At 910, deposit overlayers which act an out-diffusion barrier for passivating species. At 920, pattern the sample surface to retain the deposited overlayer in selected areas. At 930, perform activation treatment of the sample to obtain p-regions in areas without the overlayer and n-type regions in areas underneath the overlayer.

Figure 10:
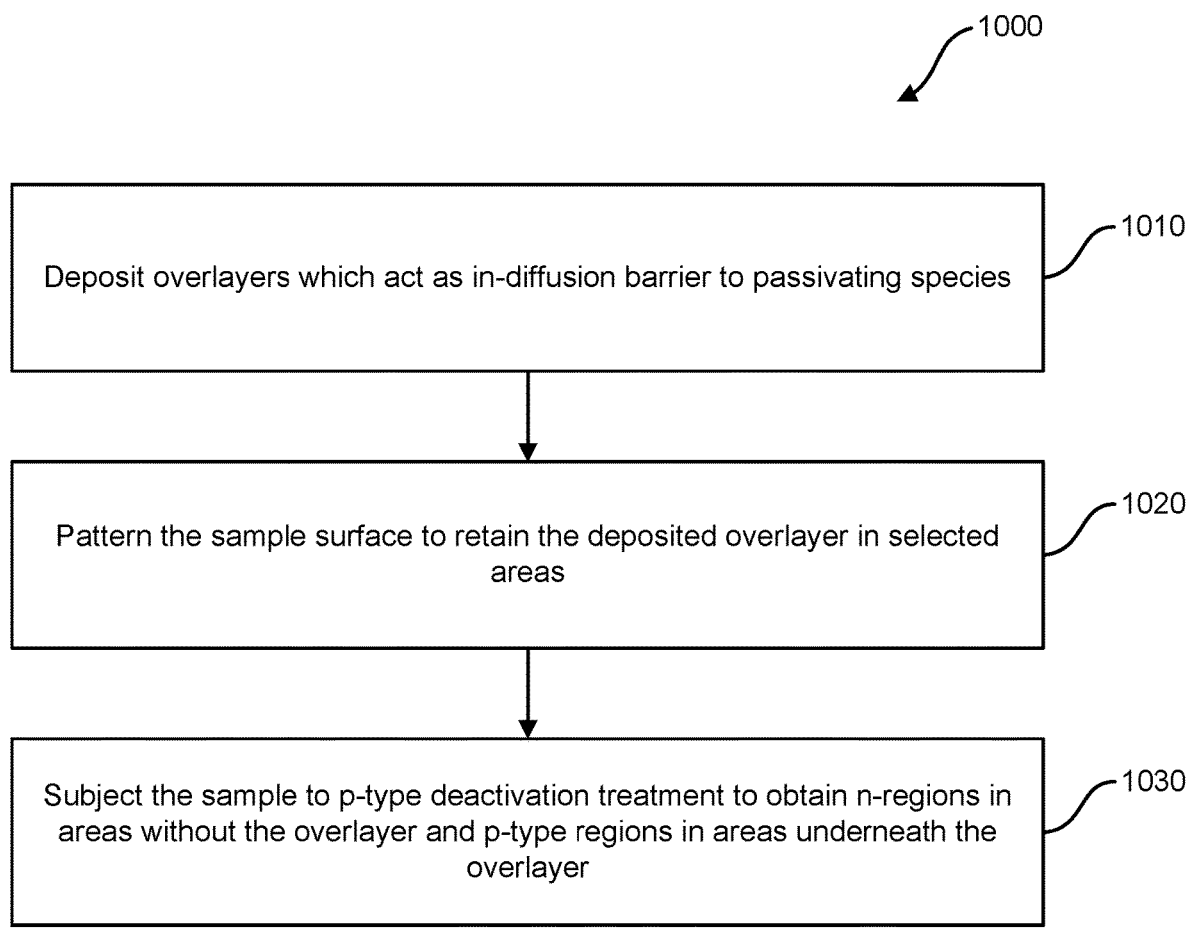
FIG. 10 is an operational flow of another implementation of a method for fabricating a III-Nitride semiconductor structure.

FIG. 10 is an operational flow of another implementation of a method 1000 for fabricating a III-Nitride semiconductor structure. At 1010, deposit overlayers which act as in-diffusion barrier to passivating species. At 1020, pattern the sample surface to retain the deposited overlayer in selected areas. At 1030, subject the sample to p-type deactivation treatment to obtain n-regions in areas without the overlayer and p-type regions in areas underneath the overlayer.

In some implementations, the p-type and n-type co-doped III-Nitride layer can be at the top layer towards to sample surface as well as a buried layer within the III-Nitride sample. In some implementations, the p-type doped positive polarization charge created compositionally graded III-Nitride alloy can be at the top layer towards to sample surface as well as a buried layer within the III-Nitride sample.

It is contemplated that patterning the sample surface could be done by any known photolithography and subsequent etching process(es).

The deposited overlayers could be a dielectric or any material layer which acts as out-diffusion barrier for passivating species, which prevents activation of the layers below.

In some implementations, subjecting the sample to a p-type activating process such as heating in nitrogen, oxygen, or a mixture of both gases in a flow, enables activation of Mg atoms in a III-Nitride material.

The deposited overlayers could be a dielectric or any material layer which act as in-diffusion barrier for passivating species, and prevents deactivation of the layers below.

In some implementations, subjecting the sample to a p-type deactivating process such as plasma exposer having passivating species, treatment with any passivating species containing gas flow or any other elements, enables deactivation of Mg atoms in a III-Nitride material.

Some implementations can include heating or cooling the sample to enable more efficient and a deeper deactivation process.

In some implementations, a lateral p-n junction can be generated, such as including but not limited to a lateral p-n diode, a lateral and vertical MOSFET, and a guard ring structure for vertical power devices, for example.

Experimental demonstration of forming pn junctions in III-Nitrides using p-type and n-type co-doping and selective p-type activation is now described.

Figure 11B:
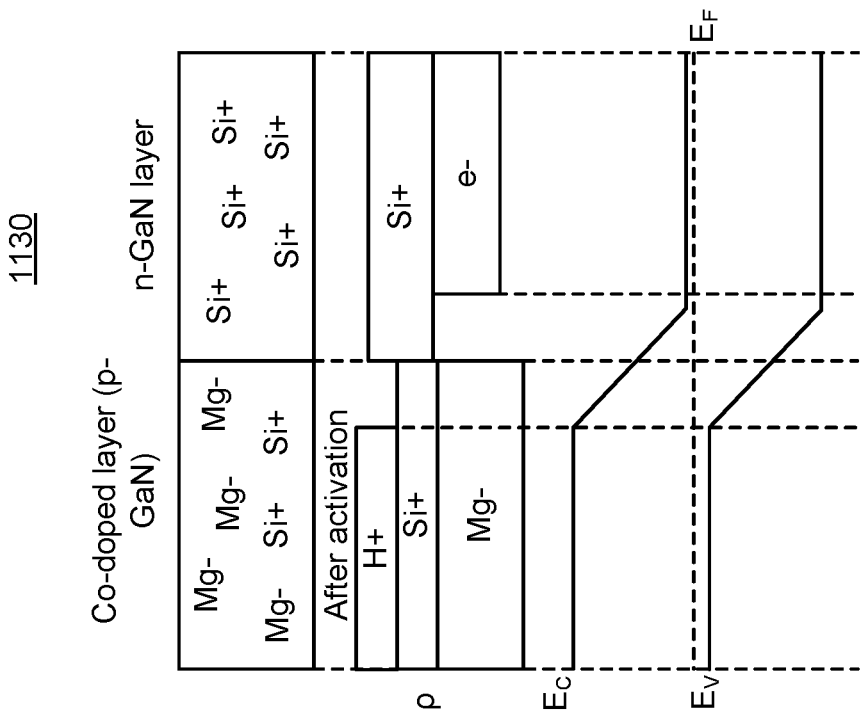
Figure 11A:
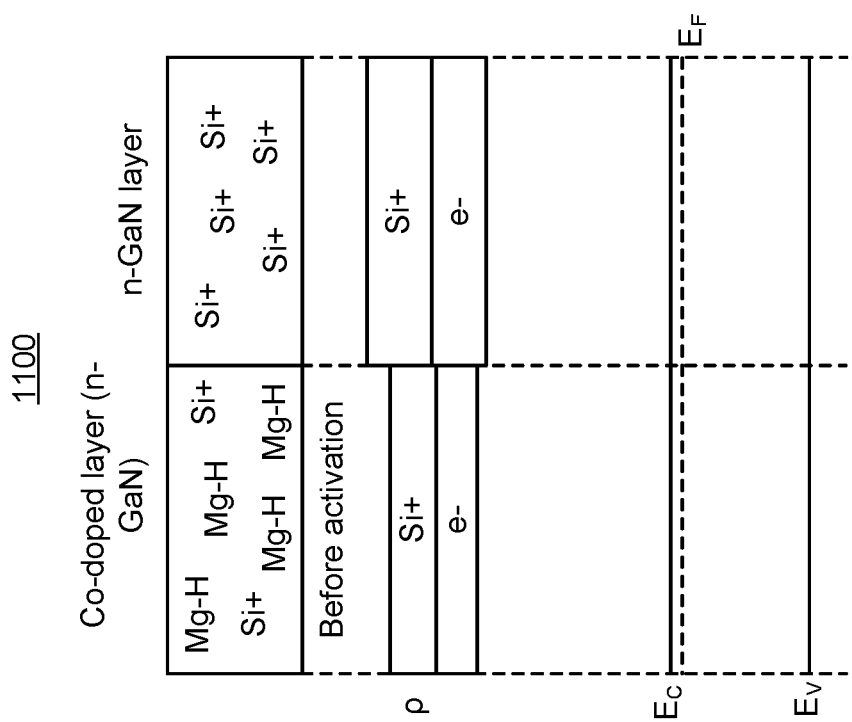

As a demonstration, co-doped/n-GaN (CN) structures were grown by MOCVD, where the entire device structure was doped with $[Si]=1.6\times10^{18}$ $cm^{-3}$, while in the co-doped region, $[Si]=1.6\times10^{18}$ $cm^{-3}/[Mg]=8\times10^{18}$ $cm^{-3}$. Ohmic contacts were made to the bottom n-type regions after mesa etching, while Ti/Au contacts were made to the top surface of the co-doped region. FIG. 11C shows this fabricated CN structure 1160. FIG. 11A shows the mechanism 1100 for the CN structure 1160 before activation of the Mg acceptors. Before activation, presence of H in co-doped region creates Mg—H complex thus preventing Mg from being an acceptor. On the other hand, Si dopants become ionized and supply electron in the co-doped region and create an n-type layer. FIG. 11B shows the mechanism 1130 for the CN structure 1160 after activation of the Mg acceptors. After activation, Mg—H complex is broken thus enabling Mg to behave as an acceptor. Since the concentration of Mg is larger than Si, the region behaves as a p-type region with holes.

Figure 12A:
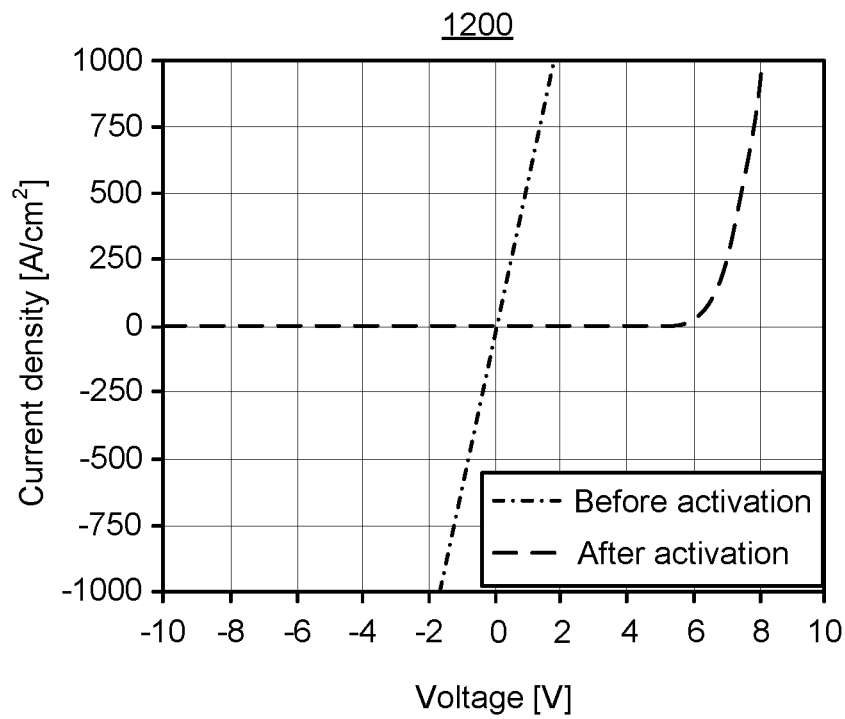
FIGS. 12A and 12B show IV characteristics of the CN structure before and after activation in linear scale and in semi-log scale, respectively.
Figure 12B:
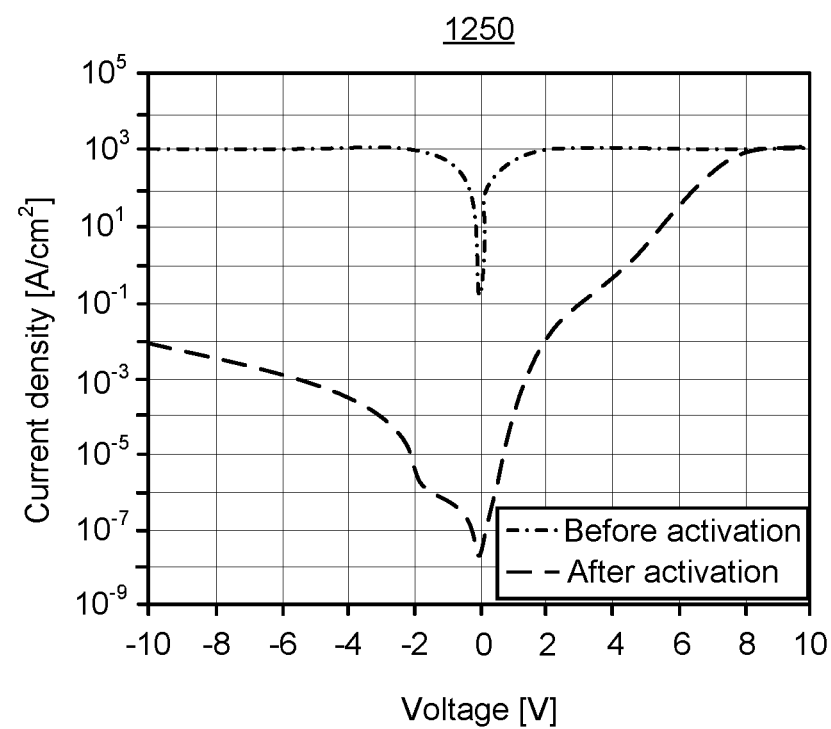

FIGS. 12A and 12B show IV characteristics 1200, 1250 of the CN structure before and after activation in linear scale and in semi-log scale, respectively. Before activation, the co-doped N junction is found to show resistive/ohmic behavior, showing that the co-doped layer is behaving as an n-type layer, as expected. After activation, the same structure showed PN junction behavior, with a turn-on voltage over 4 V, and clear rectification of several orders of magnitude. These results demonstrate that p-type and n-type conductivity can be produced in the same layer by removal of hydrogen species.

The realization of NPN layers is described, with buried p-type regions, which are relevant for future power device applications. To demonstrate realization of NPN and NNN layers, start with an NCN (N-type/Co-doped/N-type) structure 1360 in FIG. 13C. Mesa structures were realized, with n-type ohmic contacts deposited on the top and bottom n-type regions.

Figure 13A:
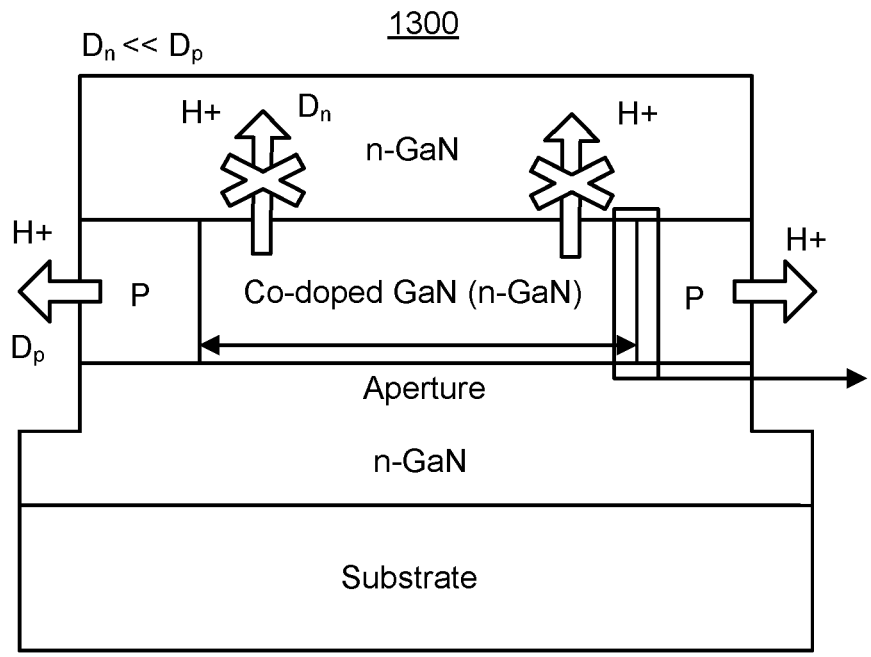
FIGS. 13A, 13B, and 13C are illustrations of the sidewall activation in an N-type/Co-doped/N-type (NCN) structure, of the energy band diagram at a boundary between n-GaN and p-GaN of the co-doped layer, and of the epitaxial NCN structure, respectively.
Figure 13B:
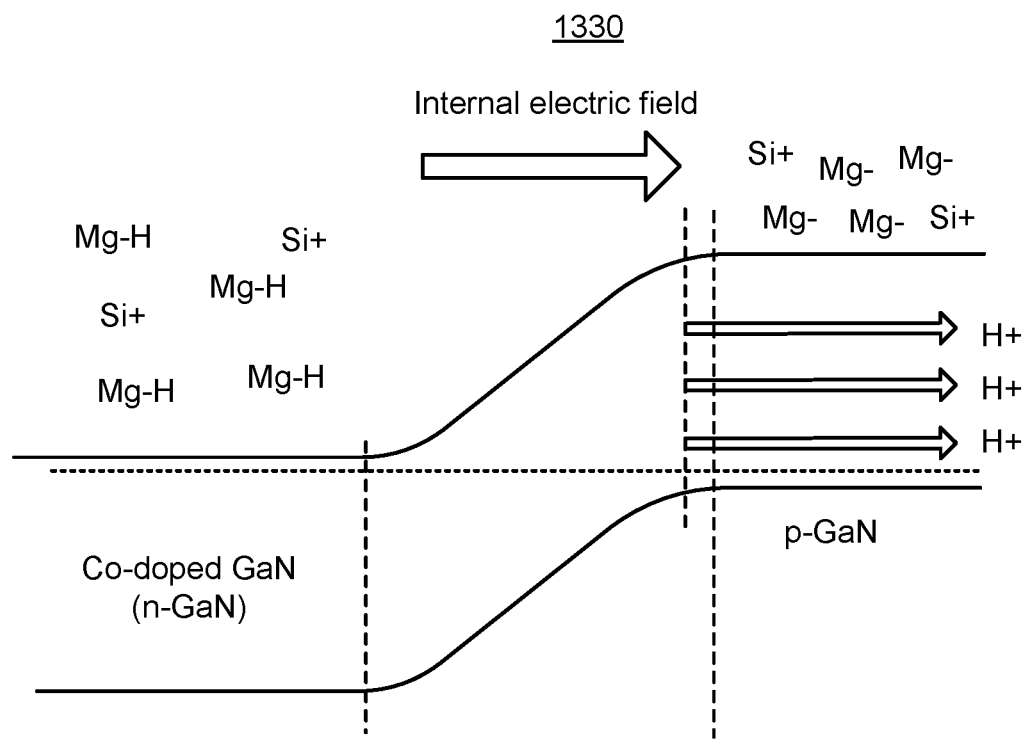
Figure 13C:
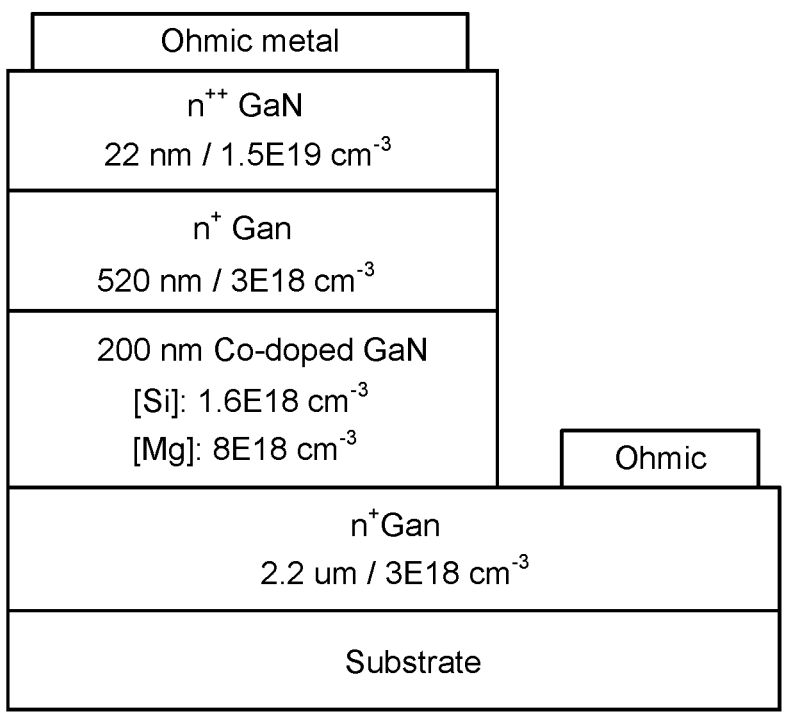

FIGS. 13A shows the sidewall activation process 1300 in the NCN structure, Initially, Mg is not activated, the center co-doped region behaves as an n-type region. After activating the center co-doped region (through the sidewall), the region behaves as an NPN junction. The top n-GaN layer blocks H diffusion from the top surface while activation of the buried co-doped region to become p-GaN takes place through the exposed sidewalls. FIG. 13B shows the energy band diagram 1330 at a boundary between n-GaN and p-GaN of the co-doped layer.

Figure 14A:
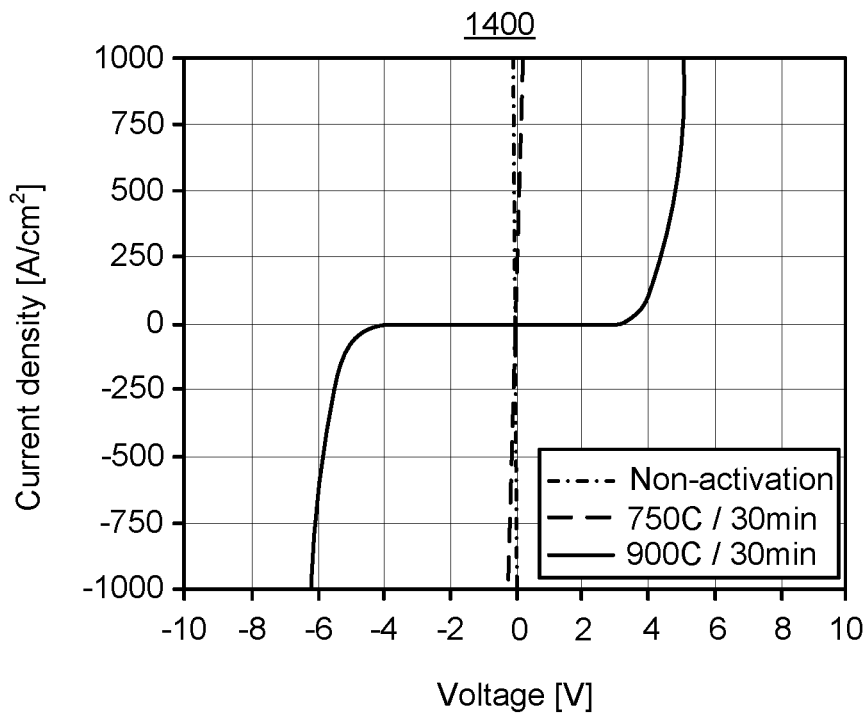
FIGS. 14A and 14B show an IV curve of the 30 µm diameter from the NCN structure before and after activation in linear scale and in semi-log scale, respectively.
Figure 14B:
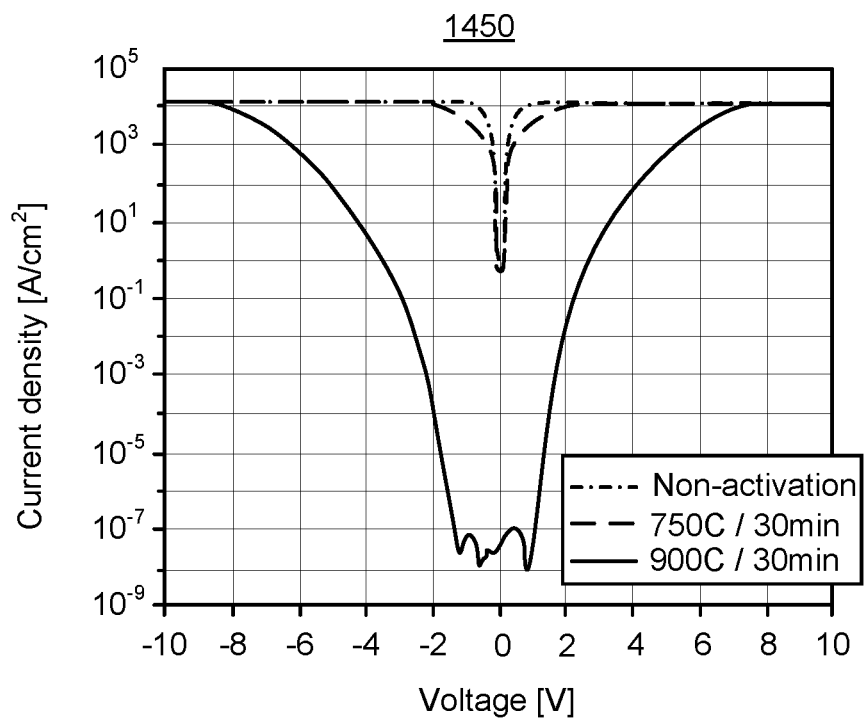

FIGS. 14A and 14B show linear scale IV characteristics 1400, and semi-log scale IV characteristics 1450 of the NCN structure of 30 um diameter before and after activation. Before activation, the NCN structure behaves like an n-type region with low-resistance ohmic conduction. After sidewall activation occurred at 900° C. for 30 min, the layers block with on-off ratio over 1011.

Figure 15A:
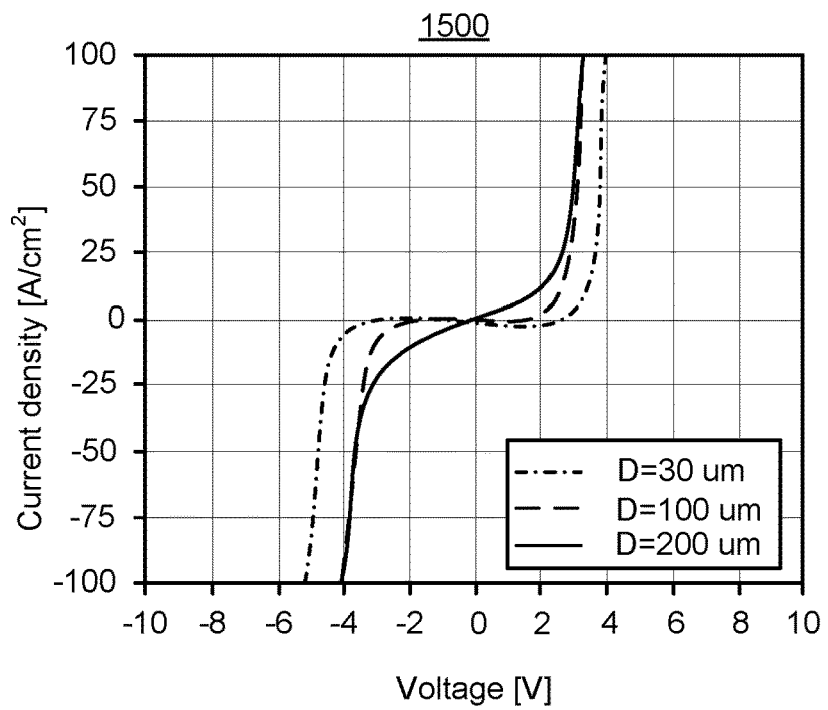
FIGS. 15A and 15B show an IV curve of different diameters from the NCN structure after activation in linear scale and in semi-log scale, respectively.
Figure 15B:
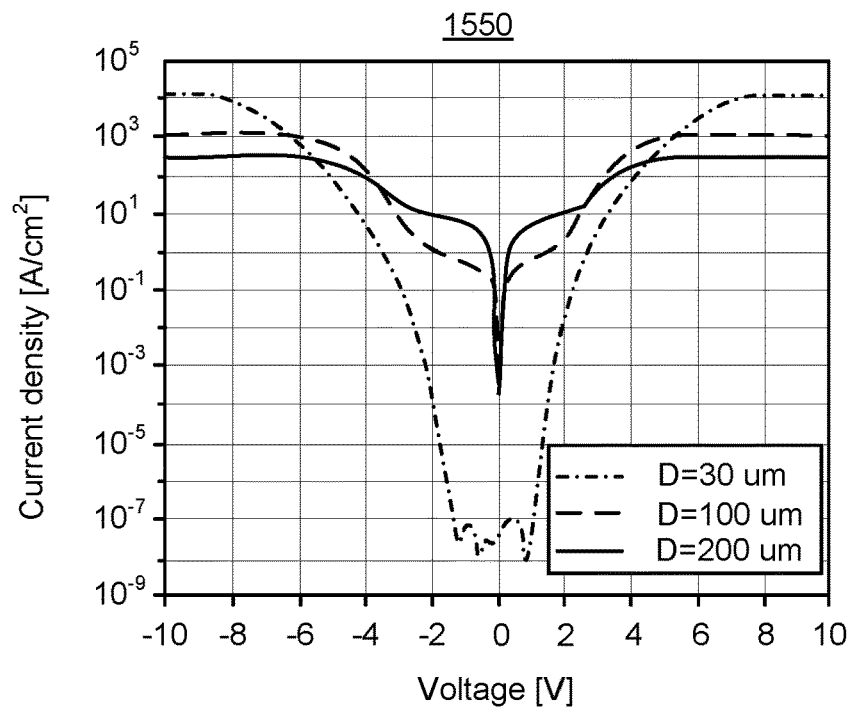

FIGS. 15A and 15B show a linear scale IV curve 1500 and semi-log scale IV curve 1550 of NCN structures of 30 μm, 100 μm and 200 μm diameter after activation. These curves prove that the co-doped layer in NCN structure of 30 μm diameter, entirely becomes p type and realizes an NPN structure with current blocking capability. Larger diameter co-doped layers become partially p-type from the side wall region and remain n-type in the middle region, these have low or no turn on voltage and very low rectification.

FIG. 16 is a table 1600 showing the calculated zero capacitance of NPN structure with 30 μm diameter considering each depletion width and Debye length and the measured zero capacitance with various frequency. Capacitance-voltage characterization shows that the NPN region has a zero-bias capacitance exactly equivalent to that expected from two back-to-back PN junctions. Therefore, the co-doped activated region behaves like a conductive p-type layer.

In summary, the co-doping technique is used to create p-type and n-type conductivity within the same film by selectively removing H and to make the buried aperture in NCN structure from sidewall activation without regrowth process. Thus, selectively patterned p-type and n-type GaN regions can be obtained.

In an implementation, a semiconductor structure comprises: a first region doped with a p-type dopant, an n-type dopant, and a passivating species, such that the passivating species deactivates an acceptor, and an active p-type dopant concentration is less than an active donor concentration ($N_D$), thus creating a n-type layer; and a second region adjacent the first region, wherein the second region is doped with the p-type dopant, the n-type dopant, and wherein the concentration of the passivating species is lower than the first region so that a p-type dopant concentration is higher than the active donor concentration ($N_D$), thus creating a p-type layer.

Implementations may include some or all of the following features. The p-type dopant is Mg, the n-type dopant is Si or Ge, and the passivating species is H, and wherein the semiconductor structure is a III-Nitride semiconductor layer structure. The semiconductor structure is fabricated on a sample surface by a method comprising: depositing an overlayer which acts as an out-diffusion barrier for the passivating species; patterning the sample surface to retain the deposited overlayer in selected areas; and activation treatment of the sample surface to obtain p-regions in areas without the overlayer and n-type regions in areas underneath the overlayer. The overlayer comprises a dielectric or any material layer which act as out-diffusion barrier for the passivating species and prevents activation of the layers below. Patterning the sample surface comprises photo lithography and subsequent etching process or selective regrowth. Subjecting the sample surface to a p-type activating process such as heating in nitrogen, oxygen or mixture of both gas flow which enables activation of Mg atoms in a III-Nitride material. The method further comprises generating a lateral p-n junction configured for use with a lateral p-n diode, a lateral and vertical MOSFET, or a guard ring structure for vertical power devices. The semiconductor structure is fabricated on a sample surface by a method comprising: depositing an overlayer which acts as in-diffusion barrier to the passivating species; patterning the sample surface to retain the deposited overlayer in selected areas; and subjecting the sample surface to p-type deactivation treatment to obtain n-regions in areas without the overlayer and p-type regions in areas underneath the overlayer. The overlayer comprises a dielectric or any material layer which act as in-diffusion barrier for the passivating species and prevents deactivation of the layers below. Patterning the sample surface could be done by any photolithography and subsequent etching process or selective regrowth. Subjecting the sample surface to a p-type deactivating process such as plasma exposer having the passivating species or treatment with any passivating species containing gas flow or any other elements enables deactivation of Mg atoms in a III-Nitride material. The method further comprises heating or cooling the sample surface to enable efficient and deeper deactivation process. The method further comprises generating a lateral p-n junction configured for use with a lateral p-n diode, a lateral and vertical MOSFET, or a guard ring structure for vertical power devices.

In an implementation, a semiconductor structure comprises: a first region doped with a p-type dopant, a compositionally graded III-Nitride alloy that creates positive polarization charge in first region, and a passivating species, such that the passivating species deactivates an acceptor, and an active p-type dopant concentration is less than a positive polarization charge ($N_{DP}$), thus creating a n-type layer; and a second region adjacent the first region, wherein the second region is doped with the p-type dopant, the compositionally graded III-Nitride alloy that creates positive polarization charge in the second region, and wherein the concentration of the passivating species is lower than the first region so that the p-type dopant concentration is higher than the positive polarization charge concentration ($N_{DP}$), thus creating a p-type layer.

Implementations may include some or all of the following features. The p-type dopant is Mg, and the passivating species is H, and wherein the semiconductor structure is a III-Nitride semiconductor layer structure. The semiconductor structure is fabricated on a sample surface by a method comprising: depositing an overlayer which acts an out-diffusion barrier for the passivating species; patterning the sample surface to retain the deposited overlayer in selected areas; and activation treatment of the sample surface to obtain p-regions in areas without the overlayer and n-type regions in areas underneath the overlayer. The semiconductor structure is fabricated on a sample surface by a method comprising: depositing an overlayer which acts as in-diffusion barrier to the passivating species; patterning the sample surface to retain the deposited overlayer in selected areas; and subjecting the sample surface to p-type deactivation treatment to obtain n-regions in areas without the overlayer and p-type regions in areas underneath the overlayer. The overlayer comprises a dielectric or any material layer which act as in-diffusion barrier for the passivating species and prevents deactivation of the layers below. Patterning the sample surface could be done by any photolithography and subsequent etching process or selective regrowth. Subjecting the sample surface to a p-type deactivating process such as plasma exposer having the passivating species or treatment with any passivating species containing gas flow or any other elements enables deactivation of Mg atoms in a III-Nitride material. The method further comprises heating or cooling the sample surface to enable efficient and deeper deactivation process. The method further comprises generating a lateral p-n junction configured for use with a lateral p-n diode, a lateral and vertical MOSFET, or a guard ring structure for vertical power devices.

As used herein, the singular form "a," "an," and "the" include plural references unless the context clearly dictates otherwise. As used herein, the terms "can," "may," "optionally," "can optionally," and "may optionally" are used interchangeably and are meant to include cases in which the condition occurs as well as cases in which the condition does not occur.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A semiconductor structure comprising:
    a first region doped with a p-type dopant, an n-type dopant, and a passivating species, such that the passivating species deactivates an acceptor, and an active p-type dopant concentration is less than an active donor concentration ($N_D$), thus creating a n-type layer;
    a second region adjacent the first region, wherein the second region is doped with the p-type dopant, the n-type dopant, and wherein the concentration of the passivating species is lower than the first region so that a p-type dopant concentration is higher than the active donor concentration ($N_D$), thus creating a p-type layer; and
    an overlayer over the first region and the second region, wherein the overlayer is an out diffusion barrier for the passivating species.

2. The semiconductor structure of claim 1, wherein the p-type dopant is Mg, the n-type dopant is Si or Ge, and the passivating species is H, and wherein the semiconductor structure is a III-Nitride semiconductor layer structure.

3. A method for fabricating a semiconductor structure comprising: The
    depositing an overlayer on a sample surface of the semiconductor structure which acts as an out-diffusion barrier for a passivating species;
    patterning the sample surface to retain the deposited overlayer in selected areas of the sample surface; and
    performing activation treatment of the sample surface to obtain p-regions in areas without the overlayer and n-type regions in areas of the sample surface underneath the overlayer.

4. The method of claim 3, wherein the overlayer comprises a dielectric or any material layer which act as out-diffusion barrier for the passivating species and prevents activation of layers below the sample surface.

5. The method of claim 3, wherein patterning the sample surface comprises photolithography and subsequent etching process or selective regrowth.

6. The method of claim 3, wherein subjecting the sample surface to a p-type activating process such as heating in nitrogen, oxygen or mixture of both gas flow which enables activation of Mg atoms in a III-Nitride material.

7. The method of claim 3, wherein the method further comprises generating a lateral p-n junction configured for use with a lateral p-n diode, a lateral and vertical MOSFET, or a guard ring structure for vertical power devices.

8. A method for fabricating a semiconductor structure comprising:
    depositing an overlayer on a sample surface of a semiconductor surface which acts as in-diffusion barrier to a passivating species;
    patterning the sample surface to retain the deposited overlayer in selected areas of the sample surface; and
    subjecting the sample surface to p-type deactivation treatment to obtain n-regions in areas without the overlayer and p-type regions in areas of the sample surface underneath the overlayer.

9. The method of claim 8, wherein the overlayer comprises a dielectric or any material layer which act as in-diffusion barrier for the passivating species and prevents deactivation of layers below the sample surface.

10. The method of claim 8, wherein patterning the sample surface could be done by any photolithography and subsequent etching process or selective regrowth.

11. The method of claim 8, wherein subjecting the sample surface to a p-type deactivating process such as plasma exposer having the passivating species or treatment with any passivating species containing gas flow or any other elements enables deactivation of Mg atoms in a III-Nitride material.

12. The method of claim 8, wherein the method further comprises heating or cooling the sample surface to enable efficient and deeper deactivation process.

13. The method of claim 8, wherein the method further comprises generating a lateral p-n junction configured for use with a lateral p-n diode, a lateral and vertical MOSFET, or a guard ring structure for vertical power devices.

* * * * *